(12) United States Patent
So (10) Patent No.: US 7,288,444 B2
(45) Date of Patent: Oct. 30, 2007

(54) THIN FILM TRANSISTOR AND METHOD OF MANUFACTURING THE SAME

(75) Inventor: Woo-Young So, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 369 days.

(21) Appl. No.: 10/994,265

(22) Filed: Nov. 23, 2004

(65) Prior Publication Data

US 2005/0090046 A1 Apr. 28, 2005

Related U.S. Application Data

(63) Continuation-in-part of application No. 10/801,146, filed on Mar. 16, 2004, which is a continuation of application No. 10/114,463, filed on Apr. 3, 2002, now Pat. No. 6,706,573.

(30) Foreign Application Priority Data

Apr. 4, 2001 (KR) .............................. 2001-018010

(51) Int. Cl.
*H01L 21/00* (2006.01)

(52) U.S. Cl. ...................... 438/149; 438/151; 438/162; 438/166

(58) Field of Classification Search ................ 438/149, 438/151, 166, 162
See application file for complete search history.

(56) References Cited

U.S. PATENT DOCUMENTS

| | | | |
|---|---|---|---|
| 4,997,780 A | 3/1991 | Szluk et al. ................. | 438/153 |
| 5,451,766 A * | 9/1995 | Van Berkel .............. | 250/208.1 |
| 5,728,592 A * | 3/1998 | Oki et al. .................... | 438/161 |
| 5,904,509 A | 5/1999 | Zhang et al. ................ | 438/154 |
| 5,994,173 A * | 11/1999 | Oki et al. .................... | 438/161 |
| 6,130,456 A * | 10/2000 | Oki et al. .................... | 257/347 |
| 6,218,220 B1 | 4/2001 | So .............................. | 438/151 |
| 6,396,147 B1 | 5/2002 | Adachi et al. .............. | 257/758 |

(Continued)

FOREIGN PATENT DOCUMENTS

CN 1155166 A 7/1997

*Primary Examiner*—Laura M. Schillinger
(74) *Attorney, Agent, or Firm*—H.C. Park & Associates, PLC (57) ABSTRACT

A method of manufacturing a thin film transistor that provides high electric field mobility is disclosed. In one embodiment, the method includes: a) forming an amorphous silicon layer and a blocking layer on an insulating substrate; b) forming a photoresist layer having first and second photoresist patterns on the blocking layer, the first and second photoresist patterns spaced apart from each other; c) etching the blocking layer using the first photoresist pattern as a mask to form first and second blocking patterns; d) reflowing the photoresist layer, so that the first and second photoresist patterns abut on each other to entirely cover the first and second blocking patterns; e) forming a capping layer and a metal layer over an entire first surface of the insulating substrate; f) removing the photoresist layer to expose the blocking layer and an offset region between the blocking layer and the metal layer; g) crystallizing the amorphous silicon layer by diffusing metals in the metal layer through the capping into the amorphous silicon layer; h) etching the poly silicon layer using the first and second blocking patterns as a mask to form first and second semiconductor layers; and i) removing the first and second blocking patterns.

19 Claims, 14 Drawing Sheets

U.S. PATENT DOCUMENTS

| | | | |
|---|---|---|---|
| 6,514,803 B1 | 2/2003 | Arai et al. | 438/164 |
| 6,521,491 B2 | 2/2003 | Lee et al. | 438/156 |
| 6,586,287 B2* | 7/2003 | Joo et al. | 438/166 |
| 6,706,573 B2* | 3/2004 | So | 438/166 |
| 6,809,785 B2* | 10/2004 | Fujino | 349/114 |
| 6,939,754 B2* | 9/2005 | Moriguchi et al. | 438/162 |
| 6,975,375 B2* | 12/2005 | Fujino | 349/113 |
| 7,112,475 B2* | 9/2006 | So | 438/149 |
| 7,208,352 B2* | 4/2007 | So | 438/149 |
| 2002/0058365 A1 | 5/2002 | Lee et al. | 438/166 |
| 2002/0068390 A1 | 6/2002 | Gosain et al. | 438/149 |
| 2002/0146869 A1* | 10/2002 | So | 438/149 |
| 2002/0158994 A1* | 10/2002 | Hashimoto et al. | 349/43 |
| 2002/0176029 A1* | 11/2002 | Fujino | 349/43 |
| 2003/0032210 A1 | 2/2003 | Takayama et al. | 438/30 |
| 2003/0169382 A1* | 9/2003 | Fujino | 349/43 |
| 2004/0175871 A1* | 9/2004 | So | 438/151 |
| 2005/0090046 A1* | 4/2005 | So | 438/151 |
| 2005/0140869 A1* | 6/2005 | Yang et al. | 349/114 |
| 2005/0230348 A1* | 10/2005 | Kido | 216/58 |
| 2006/0278606 A1* | 12/2006 | Park et al. | 216/28 |

\* cited by examiner

THIN FILM TRANSISTOR AND METHOD OF MANUFACTURING THE SAME

CROSS REFERENCE TO RELATED APPLICATIONS

This application is a continuation-in-part of co-pending U.S. application Ser. No. 10/801,146 filed Mar. 16, 2004, which is a continuation of U.S. application Ser. No. 10/114,463 filed Apr. 3, 2002, now issued U.S. Pat. No. 6,706,573, the disclosures of which are herein incorporated by reference in their entireties. This application also claims priority to Korean Application No. 2001-18010, filed Apr. 4, 2001, in the Korean Industrial Property Office, the disclosure of which is incorporated herein by reference in its entirety.

BACKGROUND OF THE INVENTION

1. Field of the Invention

The present invention relates to a thin film transistor and a method of manufacturing the same, and, more particularly, to a thin film transistor manufactured according to a method that provides high electrified mobility, high reliability and simplified manufacturing.

2. Description of Related Art

A poly silicon layer is generally used as a semiconductor layer of a thin film transistor (TFT). The poly silicon layer is formed such that an amorphous silicon layer is first deposited on a substrate and crystallized at a predetermined temperature. A method of crystallizing the amorphous silicon layer includes an eximer laser annealing (ELA) technique, a solid phase crystallization (SPC) technique, and a metal induced lateral crystallization (MILC) technique.

Of these techniques, the MILC technique is disclosed in U.S. Pat. No. 6,097,037 and has an advantage in that the amorphous silicon layer is crystallized at a relatively low temperature and at a relatively short processing time in comparison with the ELA technique and the SPC technique.

Figure 1A:
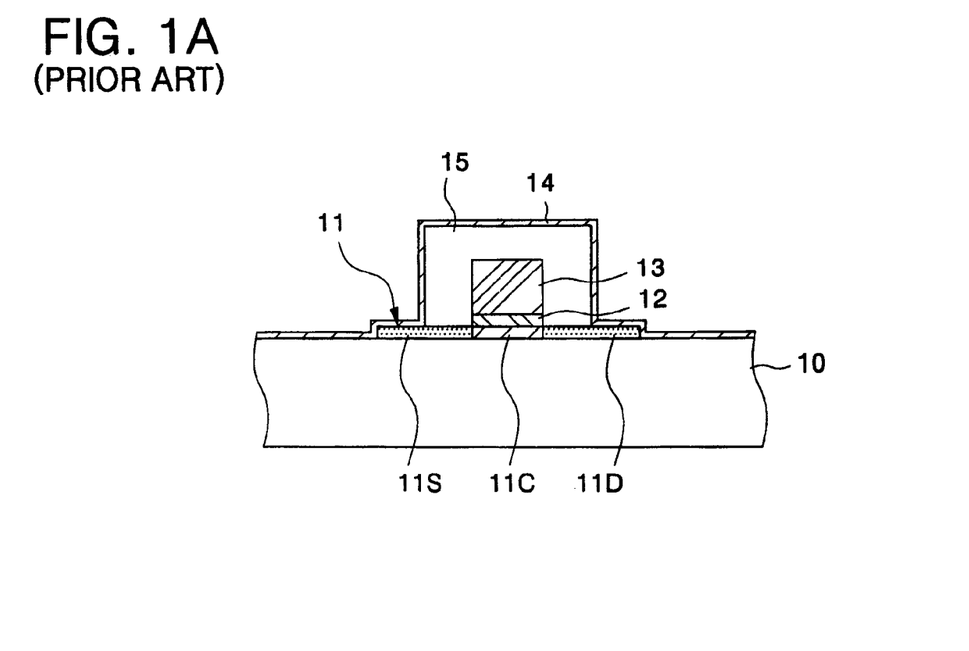
FIGS. 1A and 1B are cross-sectional views illustrating a process of manufacturing the thin film transistor (TFT) using an MILC technique according to conventional methods.
Figure 1B:
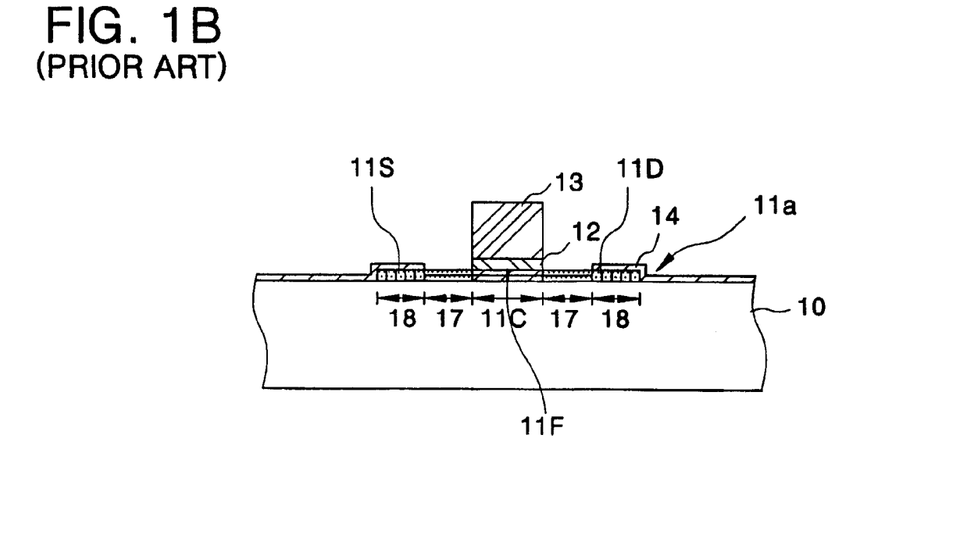

FIGS. 1A to 1B are cross-sectional views illustrating a process of manufacturing the TFT using the MILC technique according to conventional methods.

Referring to FIG. 1A, an amorphous silicon layer 11 is formed such that an amorphous silicon is deposited on an insulating substrate 10 using a low pressure chemical vapor deposition (LPCVD) technique and patterned in the form of an island.

A gate insulating layer 12 and a gate electrode 13 are sequentially formed on the amorphous silicon layer 11 while exposing both end portions of the amorphous silicon layer 11. A high-density impurity is ion-implanted into the exposed end portions of the amorphous silicon layer 11 to form source and drain regions 11S and 11D. A non-doped portion of the amorphous silicon layer 11 acts as a channel area 11C.

A photoresist pattern 15 is formed on the amorphous silicon layer 11 and covers the gate insulating layer 12 and the gate electrode 13. At this juncture, both end portions of the amorphous silicon layer 11 are not covered with the photoresist pattern 15. Thereafter, a metal layer 14 is deposited over the entire surface of the insulating substrate 10 using a sputtering technique. Preferably, the metal layer 14 is made of Ni, Pd, Ti, Ag, Au, Al, or Sb.

Referring now to FIG. 1B, the photoresist pattern 15 is removed using a lift-off technique, whereupon offset regions 17 are formed. Subsequently, the amorphous silicon layer 11 is crystallized by a furnace to form a poly silicon layer 11a. At this juncture, a portion of the amorphous silicon layer 11 that directly contacts the metal layer 14 is crystallized by a metal induced crystallization (MIC) technique, and the offset regions 17 and the channel area 11C are crystallized by the MILC technique.

In the conventional method of manufacturing the TFT using the MILC technique, traps are prevented since the boundaries between the MIC and MILC regions are located outside the channel area 11C, for example, within the source and drain regions 11S and 11D.

However, the conventional method of manufacturing the TFT using the MILC technique additionally requires a mask process to form the offset regions 17, thereby lowering productivity and increasing the production costs.

Also, since a crystallization is performed using the MILC technique after the gate insulating layer 12 and the gate electrode 13 are formed on the amorphous silicon layer 11, an interface characteristic between the gate insulating layer 12 and the channel area 11C deteriorates, and many trap sites are provided, whereby the electric field mobility is lowered.

In addition, an MILC front 11F, including a metal silicide, exists in the channel area 11C and serves as a defect of the TFT, thereby deteriorating reliability of the TFT. Here, the MILC front 11F is referred to as that portion where lateral growths meet each other when the amorphous silicon layer 11 is crystallized by the MILC technique. Such an MILC front 11F contains more metal components than other portions and becomes a defect of the semiconductor layer.

In order to locate the MILC front 11F outside the channel area 11C, a method is introduced such that the MIC region is non-symmetrically formed centering on the channel area 11C to perform a crystallization. That method is disclosed in IEEE Electron Device Letters, vol. 21, no. 7, Jul. 2000, and is entitled "The Effects of Electrical Stress and Temperature on the Properties of Polycrystalline Silicon Thin Film Transistor Fabricated by Metal Induced Lateral Crystallization." However, this method has a problem in that a crystallization is non-symmetrically performed and thus a processing time for crystallization is increased.

SUMMARY OF THE INVENTION

To overcome the problems described above, preferred embodiments of the present invention provide a thin film transistor (TFT) having a high electric field mobility, a high productivity, and a high reliability.

In order to provide a thin film transistor (TFT) having a high electric field mobility, a high productivity, and a high reliability, preferred embodiments of the present invention provide one or more methods of manufacturing a thin film transistor. In one embodiment, the method may include: a) forming an amorphous silicon layer and a blocking layer on an insulating substrate; b) forming a photoresist layer having first and second photoresist patterns on the blocking layer, the first and second photoresist patterns spaced apart from each other; c) etching the blocking layer using the first photoresist pattern as a mask to form first and second blocking patterns; d) reflowing the photoresist layer, so that the first and second photoresist patterns abut on each other to entirely cover the first and second blocking patterns; e) forming a capping layer and a metal layer over an entire first surface of the insulating substrate; f) removing the photoresist layer to expose the blocking layer and an offset region between the blocking layer and the metal layer; g) crystallizing the amorphous silicon layer by diffusing metals in the metal layer through the capping into the amorphous silicon layer; h) etching the polysilicon layer using the first and second blocking patterns as a mask to form first and second semiconductor layers; and i) removing the first and second blocking patterns.

The present invention further provides a method of manufacturing a thin film transistor. In one embodiment, such a method may include: a) forming an amorphous silicon layer on an insulating substrate; b) forming a first photoresist layer on the amorphous silicon layer while exposing edge portions of the amorphous silicon layer; c) forming a capping layer and a metal layer over an entire first surface of the insulating substrate; d) removing the first photoresist layer to expose a portion of the amorphous silicon layer under the first photoresist layer; e) crystallizing the amorphous silicon layer by diffusing metals in the metal layer through the capping into the amorphous silicon layer; f) a second photoresist layer having first and second photoresist patterns on the polysilicon layer, wherein the first and second photoresist patterns are spaced apart from each other; g) etching the polysilicon layer using the first and second photoresist patterns as a mask to form first and second semiconductor layers; and h) removing the first and second photoresist patterns.

The metal layer is preferably made of Ni or Pd and preferably has a thickness of hundreds of Å. In one embodiment, the thickness may be in the range of about 1 Å to about 5000 Å. Preferably, a crystallization of the amorphous silicon layer is performed at a temperature of 400° C. to 600° C. The capping layer is made of SiO2 or SiNx.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which.

DETAILED DESCRIPTION OF PREFFERED EMBODIMENTS

Reference will now be made in detail to preferred embodiments of the present invention, an example of which is illustrated in the accompanying drawings.

One method of implementing one or more embodiments of the invention is shown in the plan views of FIGS. 2A to 2I and the corresponding cross-sectional side views of FIGS. 3A to 3I.

Figure 2A:
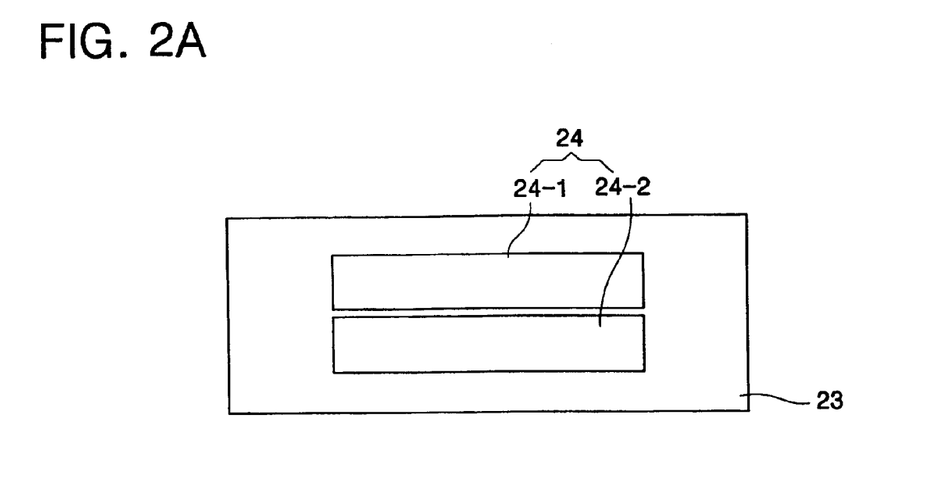
FIGS. 2A, 2B, 2C, 2D, 2E, 2F, 2G, 2H, and 2I (hereinafter, FIGS. 2A to 2I) are plan views illustrating a process of manufacturing a TFT according to an embodiment of the present invention.
Figure 3A:
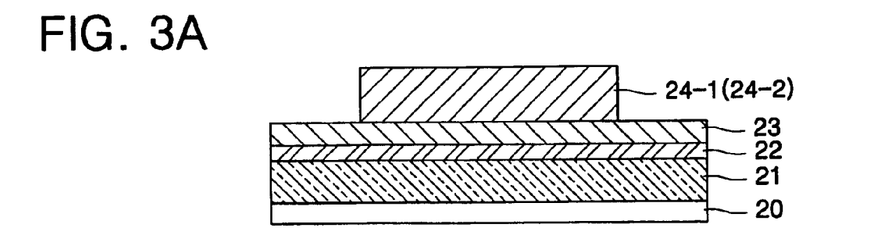
FIGS. 3A, 3B, 3C, 3D, 3F, 3G, 3H, and 3I (hereinafter, FIGS. 3A to 3I) are cross-sectional views taken along line III-III of FIG. 2I, illustrating a process of manufacturing the TFT according to an embodiment of the present invention.

Referring to FIGS. 2A and 3A, a buffer layer 21, an amorphous silicon layer 22 and a blocking layer 23 are sequentially formed on an insulating substrate 20. The buffer layer 21 is preferably made of an oxide layer and serves to prevent an impurity from being diffused into a semiconductor layer which will be formed in a subsequent process. The blocking layer 23 is preferably made of an oxide layer.

There are two methods to form the buffer layer 21, the amorphous silicon layer 22, and the blocking layer 23. A first method is that after the buffer layer 21 is formed on the insulating substrate 20, the amorphous silicon layer 22 and the blocking layer 23 are deposited using a plasma-enhanced chemical vapor deposition (PECVD) technique. The second method is that the buffer 21, the amorphous silicon layer 22, and the blocking layer 23 can be sequentially deposited using the PECVD technique.

A photoresist pattern 24 is formed on the blocking layer 23. The photoresist pattern 24 has the same pattern as a mask to form a dual-channel semiconductor layer which will be formed in a subsequent process. In other words, the photoresist pattern 24 includes first and second photoresist patterns 24-1 and 24-2, which are spaced apart from each other as shown in FIG. 2A.

Figure 2B:
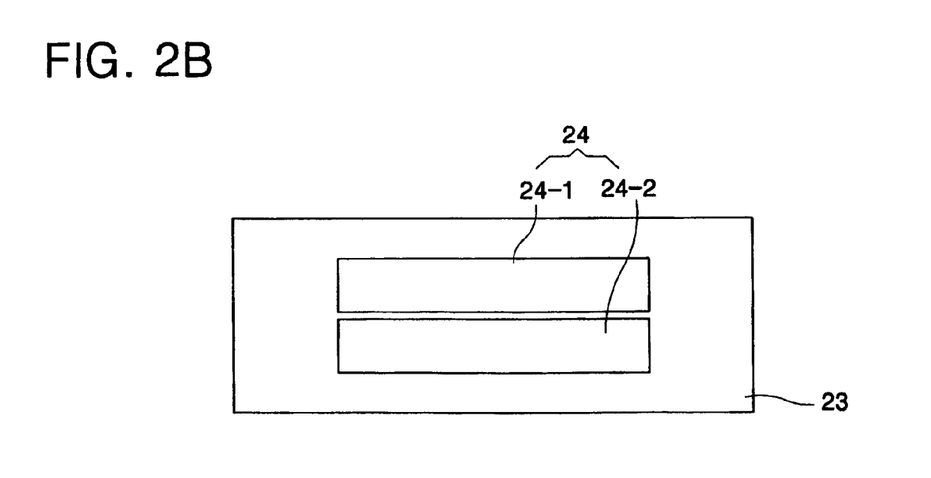
Figure 3B:
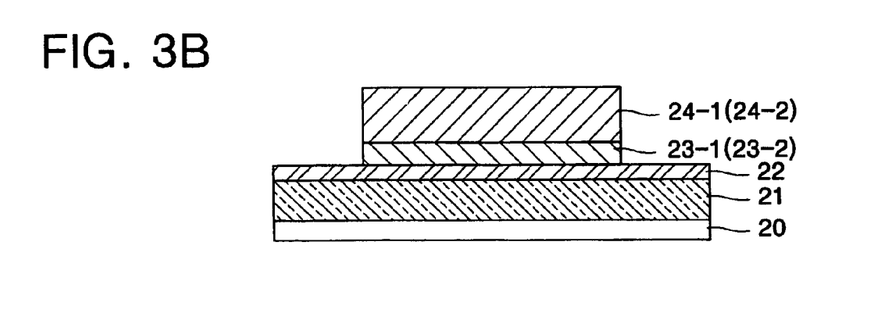

Referring now to FIGS. 2B and 3B, using the photoresist pattern 24 as a mask, the blocking layer 23 is patterned using a dry-etching technique or an HF etching solution while exposing both end portions of the amorphous silicon layer 22, so that the blocking layer 23 includes first and second blocking patterns 23-1 and 23-2. The first and second blocking patterns 23-1 and 23-2 are spaced apart from each other.

In FIGS. 2A to 2I and 3A to 3I, reference numerals in parentheses denote parts which are not shown due to a viewing angle.

Figure 2C:
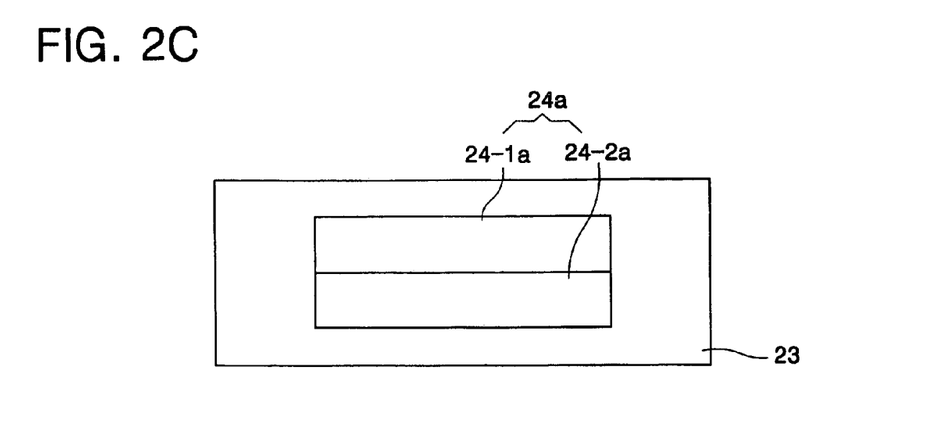
Figure 3C:
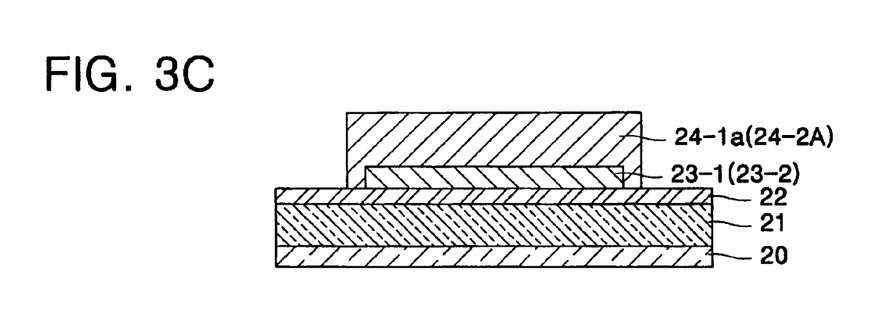

Referring now to FIGS. 2C and 3C, the photoresist pattern 24 is reflowed to entirely cover the patterned blocking layer 23. A first reflowed photoresist pattern 24-1a and a second reflowed photoresist pattern 24-2a of the reflowed photoresist pattern 24a abut on each other, so that a portion of the amorphous silicon layer 22 between the first blocking pattern 23-1 and the second blocking pattern 23-2 is covered.

Figure 2D:
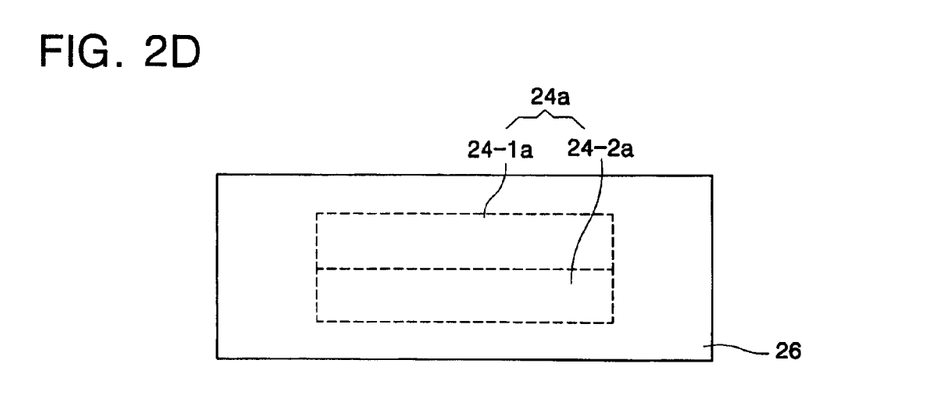
Figure 3D:
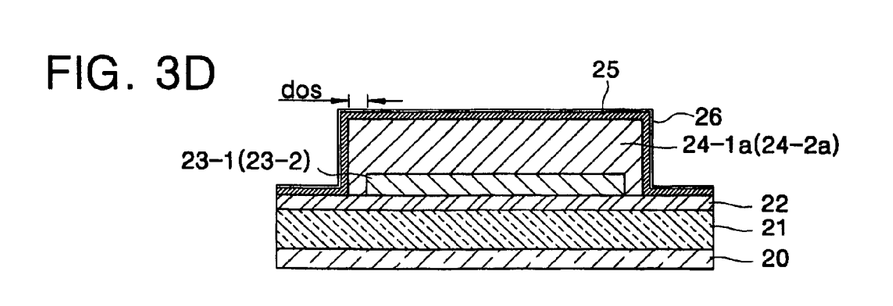

Referring now to FIGS. 2D and 3D, a capping layer 25 and a first metal layer 26 are formed over the entire surface of the substrate 20. The capping layer 25 directly contacts the exposed ends of the amorphous silicon layer 22. The capping layer 25 controls a diffused metal concentration from the first metal layer 26 to the amorphous silicon layer 22. The capping layer as a thickness of hundreds of Å and is made of SiO2 or SiNx, but is preferably made of SiO2.

The first metal layer 26 preferably has a thickness of hundreds of Å and is preferably made of a material which can react with silicon (Si) to form a silicide such as Ni or Pd.

Figure 2E:
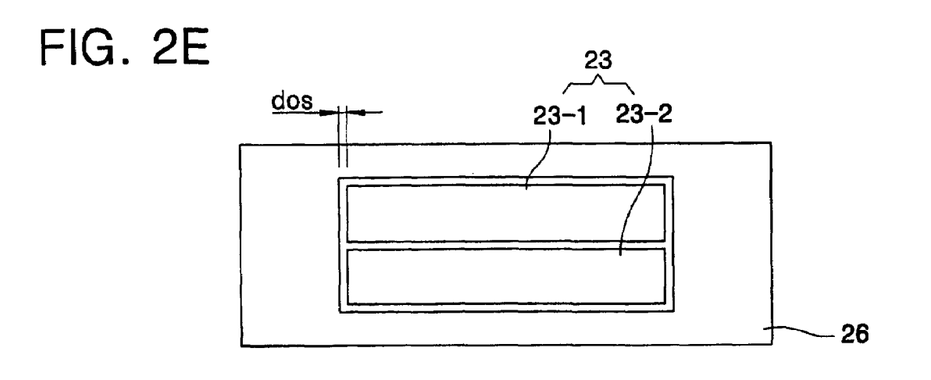
Figure 3E:
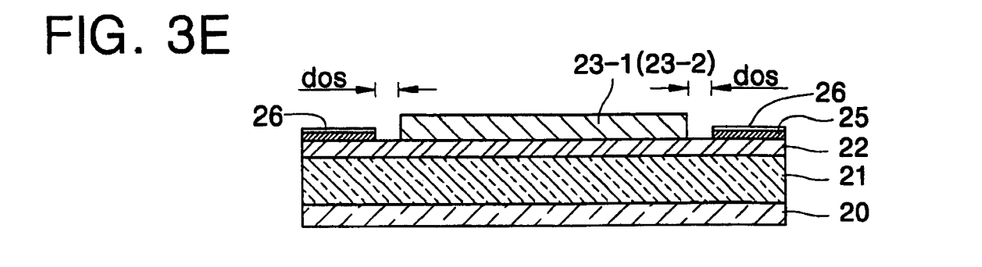

Referring now to FIGS. 2E and 3E, the first and second reflowed photoresist patterns 24-1a and 24-2a are removed to expose the blocking layer 23 and to expose an offset region "dos" of the amorphous silicon layer 22. Therefore, the capping layer 25 and the first metal layer 26 remain only on both end portions of the amorphous silicon layer 22.

Figure 2F:
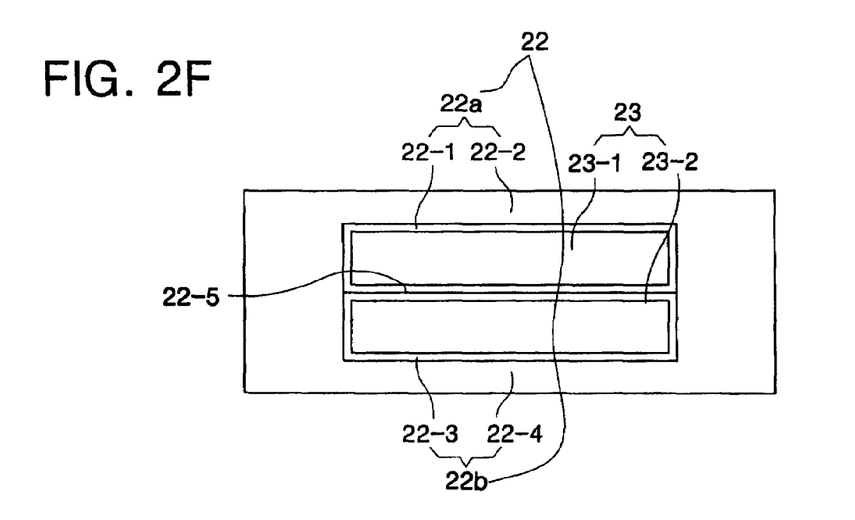
Figure 2G:
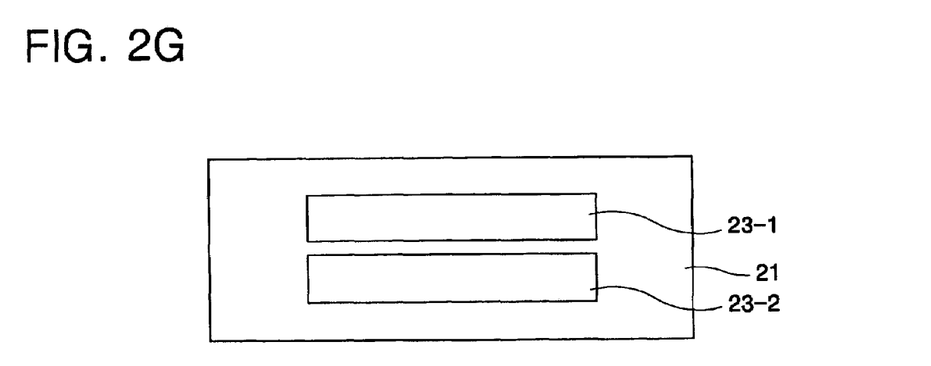
Figure 3F:
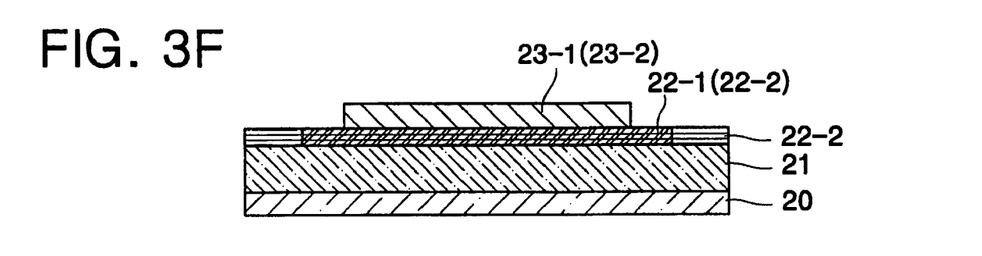
Figure 3G:
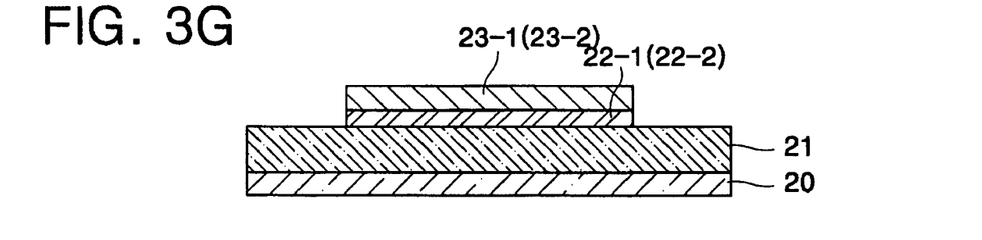

Referring now to FIGS. 2F and 3F, the amorphous silicon layer 22 is crystallized at a temperature of preferably 400° C. to 600° C. to form a poly silicon layer 22. At this moment, the first metal layer 26 and both end portions of the amorphous silicon layer 22 that directly contact the capping layer 22 are diffused to the amorphous silicon layer 22 and make seeds. And then, both end portions of the amorphous silicon layer 22 are crystallized by a super grain silicon (SGS), and a non-contact portion of the amorphous silicon layer 22 that does not contact the capping layer 25 is also crystallized by the SGS. The polysilicon layer 22 includes first and second polysilicon layers 22-1 and 22-2, and the polysilicon layer 22b includes first and second polysilicion layers 22-3 and 22-4, The first polysilicon layers 22-1 and 22-3, the second polysilicon layers 22-2 and 22-4 are all formed by the SGS, and the second polysilicon layers 22-2 and 22-4 include SGS seeds. Also, a high angle grain boundary 22-5 exists between the polysilicon layers 22a and 22b. The capping layer 25 and first metal layer 26 remaining on the polysilicon layers 22a and 22b are removed to expose the second polysilicon layers 22-2 and 22-4. The high angle grain boundary 22-5 means that grains are grown to meet each other, thereby forming grain boundaries.

Figure 2H:
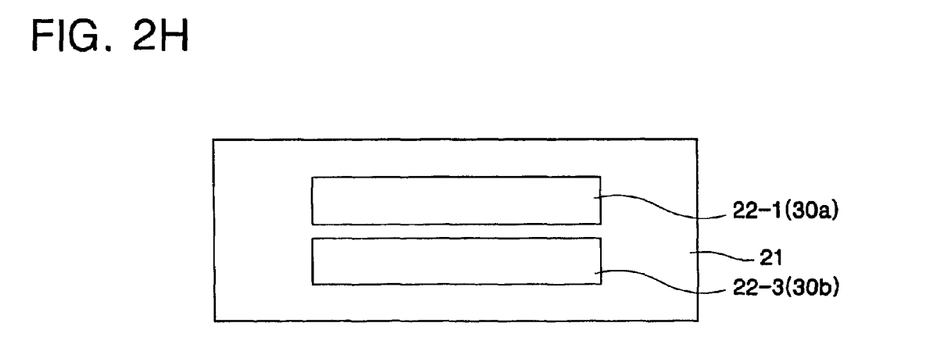
Figure 3H:
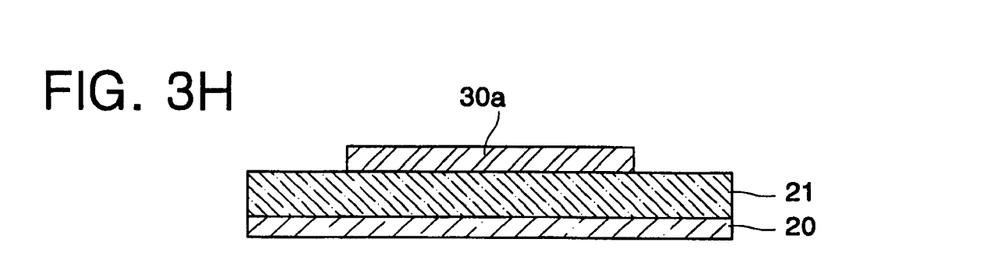

Referring now to FIGS. 2H and 3H, a surface treatment process is performed in order to improve a surface characteristic of the semiconductor layers 30a and 30b. The surface treatment process is to remove a natural oxide layer (not shown) or impurities on the semiconductor layers 30a and 30b and is performed using a dry-etching technique or an HF etching solution of 0.1% to 20%.

At this point, in case the blocking layer 23 is made of an oxide layer, the surface treatment process can be performed at the same time as the process of removing the blocking layer 23.

Figure 2I:
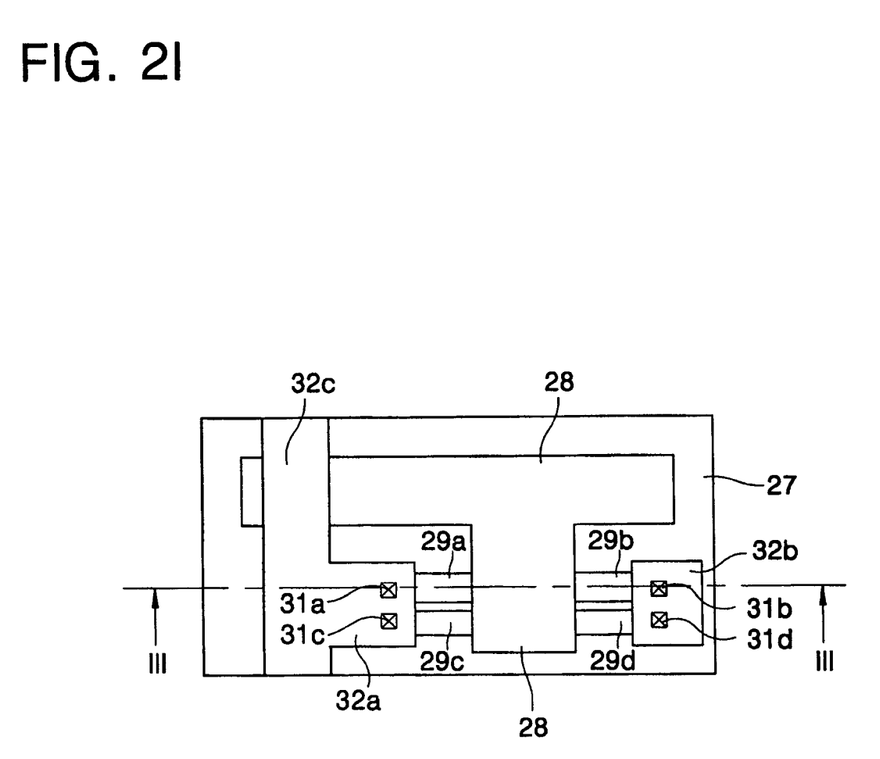
Figure 3I:
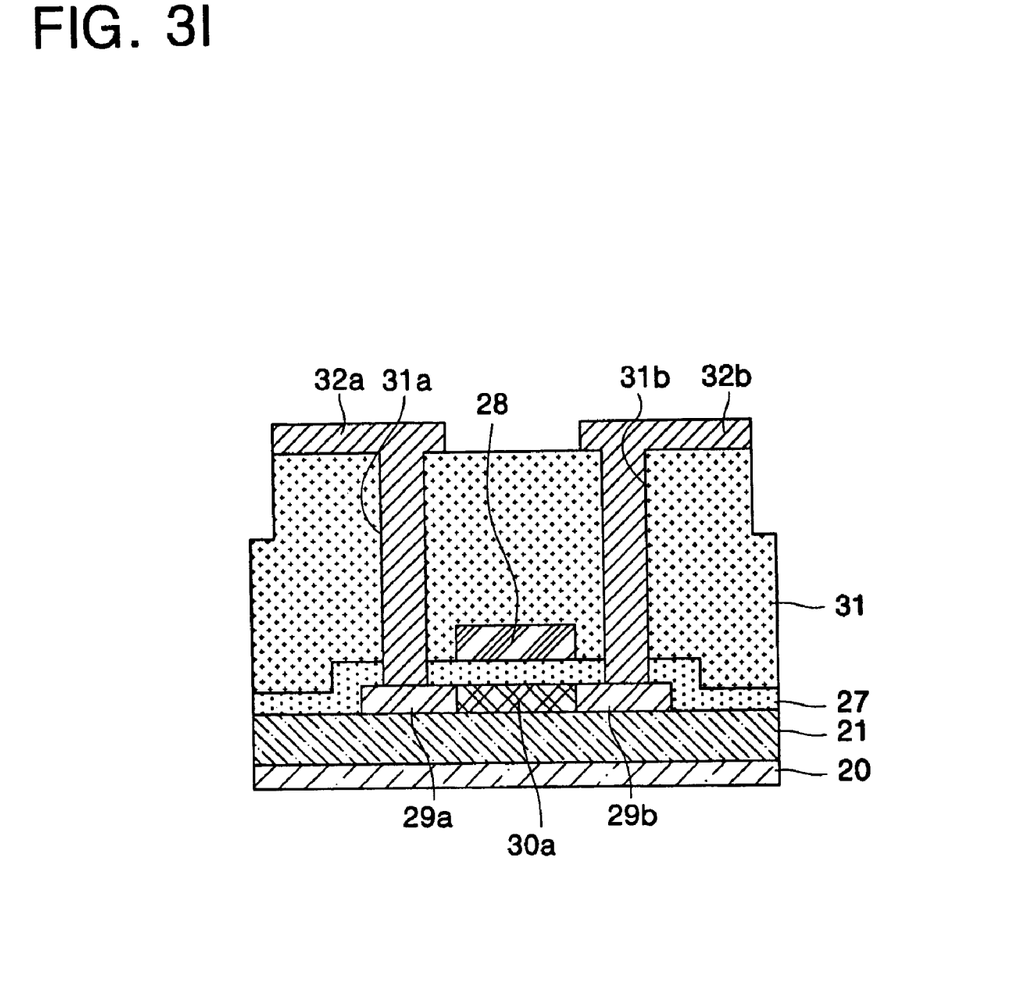

Referring now to FIGS. 2I and 3I, the TFT having a dual channel is completed using the first and second semiconductor layers 30a and 30b. In greater detail, a gate insulating layer 26 is formed over the entire surface of the substrate 20. A second metal layer is deposited over the entire surface of the substrate 20 and patterned to form a gate line 27a and a gate electrode 27b. The gate electrode 27b extends from the gate line 27a.

Subsequently, using the gate electrode 27b as a mask, a p- or an n-type high-density impurity is ion-implanted into the first and second semiconductor layers 30a and 30b to form first source and drain regions 29a and 29b and second source and drain regions 29c and 29d, respectively. The non-doped portions of the first and second semiconductor layers 30a and 30b serve as a channel area.

At this point, an offset region or a lightly doped drain (LDD) region can be formed between the source and drain regions and the channel area. The method of forming the offset region or the LDD region is well known.

Next, an interlayer insulating layer 31 is formed over the entire surface of the substrate 20. The interlayer insulating layer 31 includes contact holes 31a to 31d. The contact holes 31a and 31b are formed at a location corresponding to a portion of the first source region 29a and to a portion of the first drain region 29b, respectively. The contact holes 31c and 31d are formed at a location corresponding to a portion of the second source region 29c and to a portion of the second drain region 29d, respectively.

Thereafter, a third metal layer is deposited on the interlayer insulating layer 31 and patterned to form source and drain electrodes 32a and 32b and a data line 32c. The source electrode 32a extends from the data line 32c and is electrically connected to the first and second source regions 29a and 29c, respectively, through the contact holes 31a and 31c. The drain electrode 32b is electrically connected to the first and second drain regions 29b and 29d, respectively, through the contact holes 31b and 31d. Consequently, the TFT according to the present invention is completed.

As described herein, the TFT according to an embodiment of the present invention has numerous advantages. Since a mask process to crystallize the amorphous silicon layer is not required, the manufacturing process is simplified, thus leading to a high manufacturing yield. Also, since the high-angle grain boundary is removed, the formation of defects can be prevented, leading to high reliabilty.

One method of forming one or more embodiments of the invention is shown in the plan views of FIGS. 4A to 4H and the corresponding cross-sectional side views of FIGS. 5A to 5H.

Figure 4A:
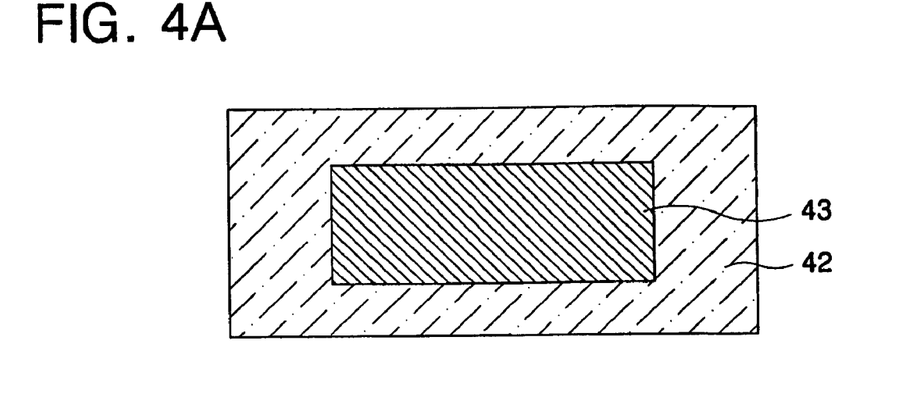
FIGS. 4A, 4B, 4C, 4D, 4E, 4F, and 4G (hereinafter, FIGS. 4A to 4G) are plan views illustrating a TFT according to another embodiment of the present invention.
Figure 5A:
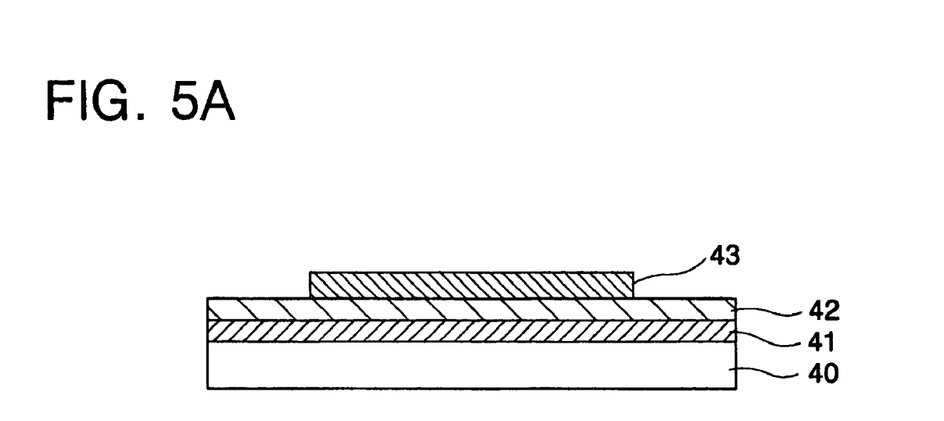
FIGS. 5A, 5B, 5C, 5D, 5E, 5F, and 5G (hereinafter, FIGS. 5A to 5G) are cross-sectional views taken along line V-V of FIG. 4G.

Referring now to FIGS. 4A and 5A, a buffer layer 41 and an amorphous silicon layer 42 are sequentially formed on an insulating substrate 40. The buffer layer 41 is preferably made of an oxide layer and serves to prevent an impurity from being diffused into a semiconductor layer which will be formed in subsequent process. At this point, the buffer layer 41 and the amorphous silicon layer 42 can be formed using the PECVD technique. Thereafter, a photoresist pattern 43 is formed on the amorphous silicon layer 42 while exposing both end portions of the amorphous silicon layer 42.

Figure 4B:
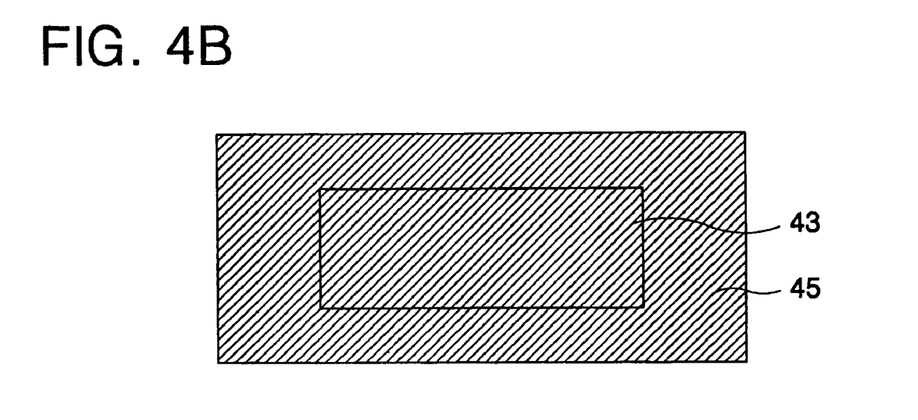
Figure 5B:
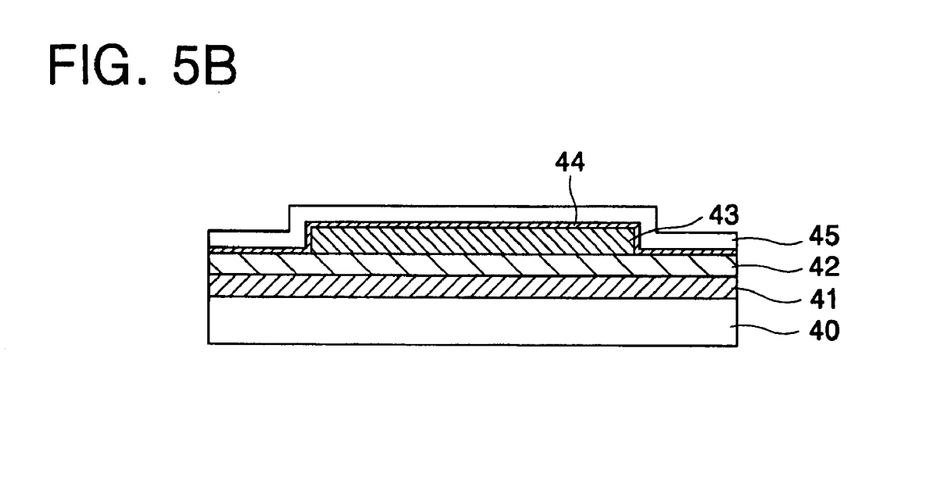

Referring now to FIGS. 4B and 5B, a capping layer 44 and a first metal layer 45 is formed over the whole surface of the substrate 40 and covers the photoresist pattern 43. The capping layer 44 directly contacts the exposed end portions of the amorphous silicon layer 42. The capping layer 44 controls a diffused metal concentration from the first metal layer 45 to the amorphous silicon layer 42. The capping layer 44 preferably has a thickness of tens to hundreds of Å and is made of SiO2 or SiNx, preferably made of SiO2.

The first metal layer 45 is preferably made of a material which reacts with silicon to form a silicide such as Pd of Ni. The first metal layer 45 preferably has a thickness of 1 Å to 5000 Å and preferably tens to hundreds of Å.

Figure 4C:
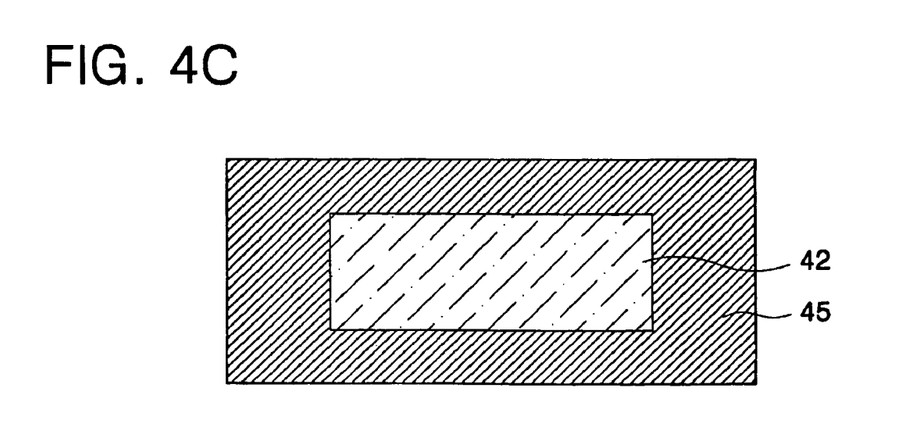
Figure 5C:
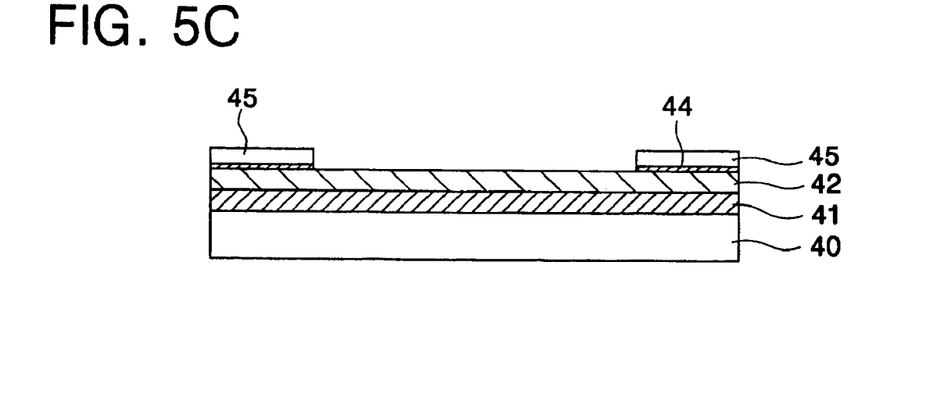

Referring now to FIGS. 4C and 5C, the photoresist pattern 43 is removed to expose a central portion of the amorphous silicon layer 42. The capping layer 44 remains only on both end portions of the amorphous silicon layer 42.

Figure 4D:
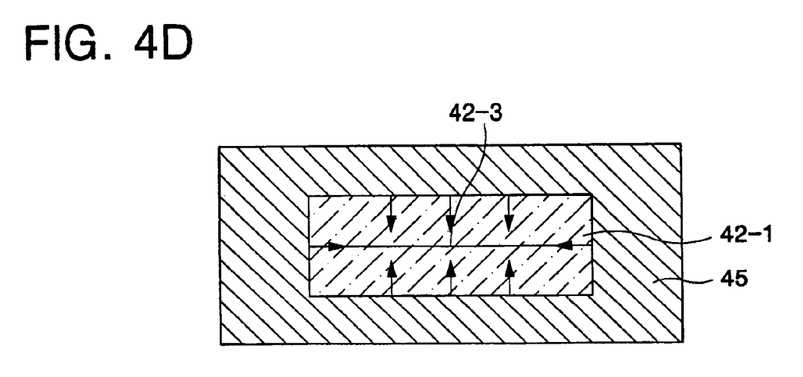
Figure 5D:
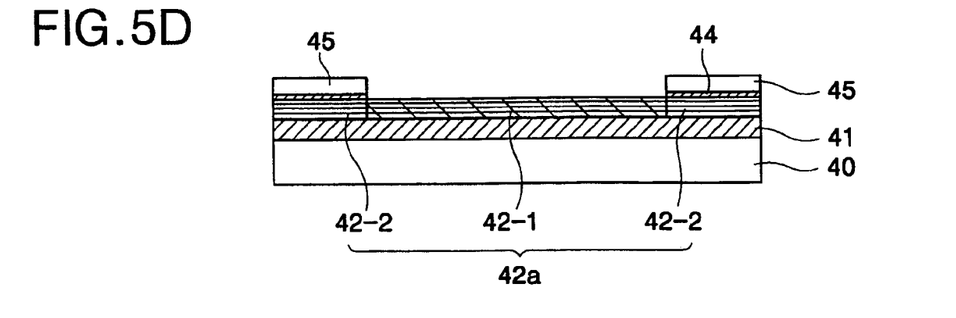

Referring now to FIGS. 4D and 5D, the amorphous silicon layer 42 is crystallized at a temperature of preferably 400° C. to 600° C. to form a poly silicon layer 42a. The exposed portion of the amorphous silicon layer 42 is crystallized by the SGS, and both end portions of the amorphous silicon layer 42 which directly contact the capping layer 44 includes the seeds for the SGS and are crystallized by the SGS.

At this juncture, since a contact region between the amorphous silicon layer 42 and the first metal layer 44 is relatively large, a crystallization speed will increase. An MILC front 42-3 exists on a central portion of the poly silicon layer 42a (i.e., MILC region 42-1).

Figure 4E:
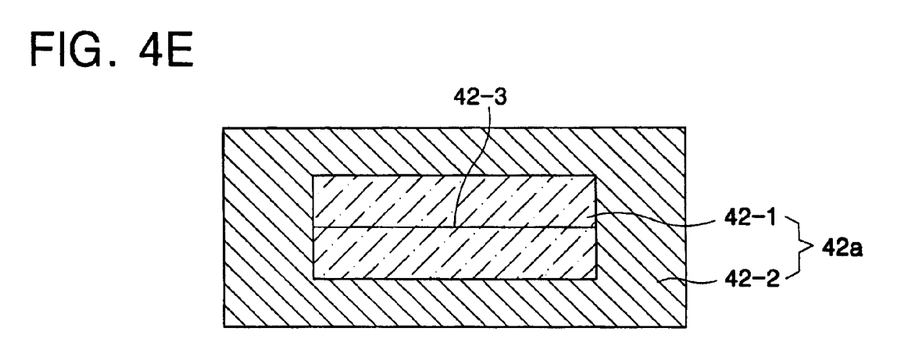
Figure 5E:
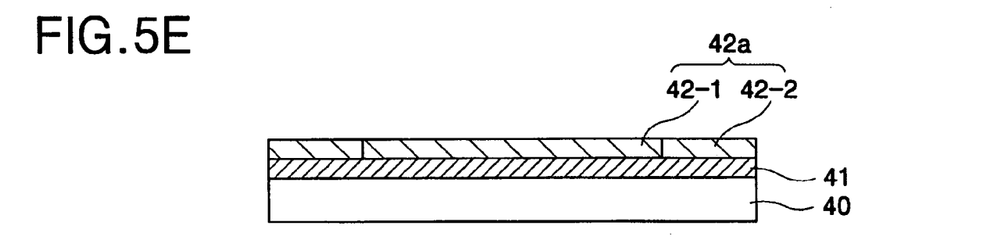

Referring now to FIGS. 4E and 5E, the capping layer 44 and the first metal layer 45 remaining on the second polysilicon layers 42-2 of the polysilicon layer 42a are removed.

Figure 4F:
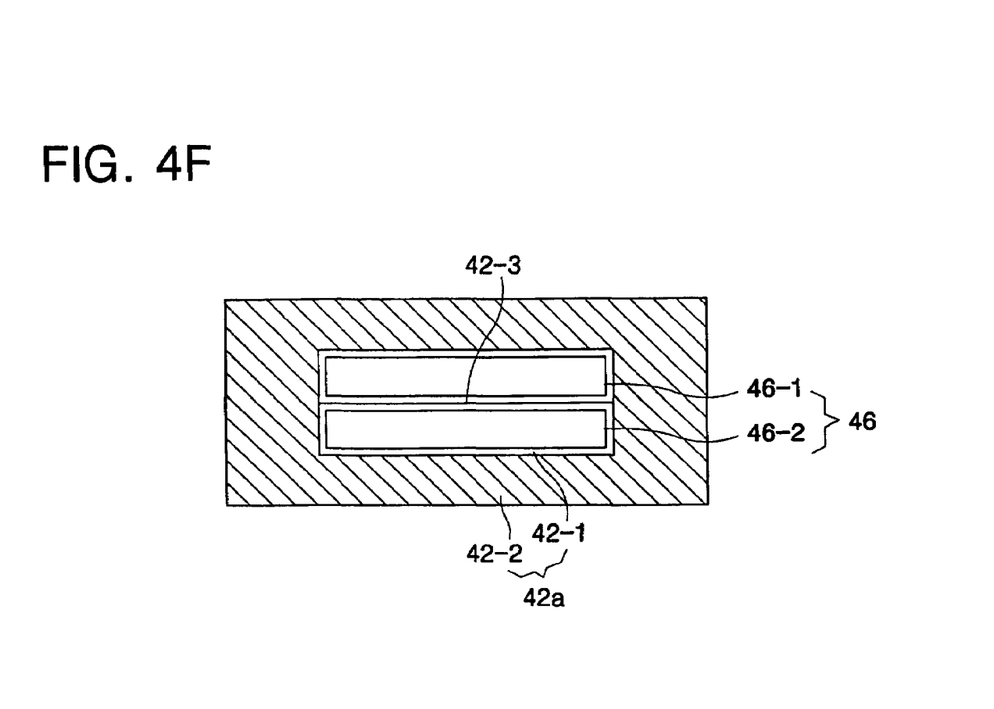
Figure 5F:
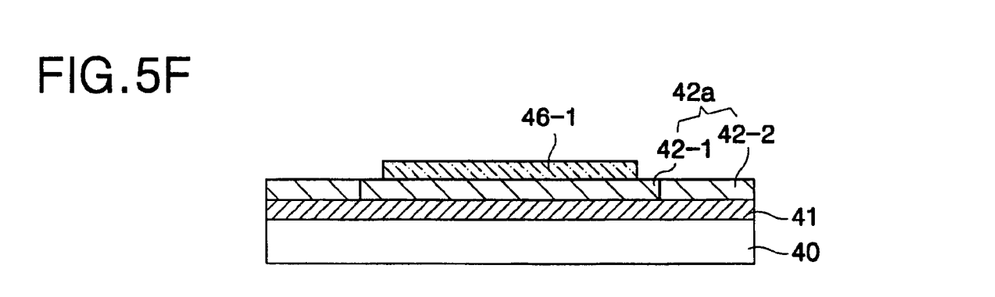

Referring now to FIGS. 4F and 5F, a photoresist pattern 46 is formed on the poly silicon layer 42a. The photo resist pattern 46 includes first and second photoresist patterns 46-1 and 46-2. The first and second photoresist patterns 46-1 and 46-2 are formed on the corresponding first polysilicon layers 42-1, respectively, and are spaced apart from each other, so that the high-angle grain boundary 42-3 is exposed.

Figure 4G:
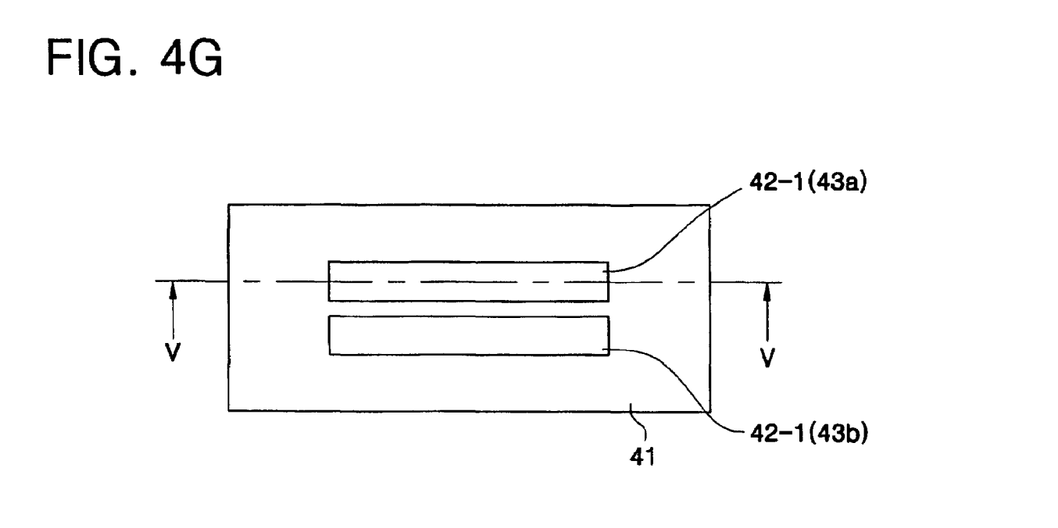
Figure 5G:
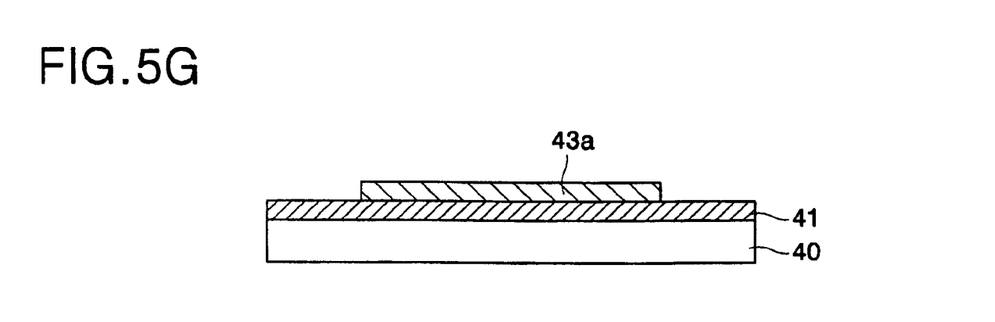

Referring now to FIGS. 4G and 5G, using the photoresist pattern 46 as a mask, the poly silicon layer 42 is etched to form first and second semiconductor layers 43a and 43b. At the same time, the MILC front 42-3 is removed. Therefore, the first and second semiconductor layers 43a and 43b include only the first polysilicon layers 42-1. Thereafter, the photoresist pattern 46 is removed.

Subsequently, a surface treatment process is performed in order to improve a surface characteristic of the semiconductor layers 43a and 43b. The surface treatment process is to remove a natural oxide layer (not shown) or impurities on the semiconductor layers 43a and 43b and is performed using a dry-etching technique or an HF etching solution of 0.1% to 20%.

Thereafter, even though not shown in the drawings, the process of FIGS. 2I and 3I is performed to complete the TFT according to another embodiment of the present invention.

As described herein, the TFT according to an embodiment of the present invention has numerous advantages. First, since crystallization simultaneously processes from all edge portions of the amorphous silicon layer, the processing time is reduced. Second, since the high angle grain boundary is removed, the formation of defects is prevented, thereby improving reliability. Third, since the amorphous silicon layer is crystallized without an additional mask process, the manufacturing process is simplified, leading to a high manufacturing yield.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of manufacturing a thin film transistor, comprising:
   a) forming an amorphous silicon layer and a blocking layer on an insulating substrate;
   b) forming a photoresist layer having first and second photoresist patterns on the blocking layer, the first and second photoresist patterns spaced apart from each other;
   c) etching the blocking layer using the first photoresist pattern as a mask to form first and second blocking patterns;
   d) reflowing the photoresist layer, so that the first and second photoresist patterns abut on each other to entirely cover the first and second blocking patterns;
   e) forming a capping layer and a metal layer over an entire first surface of the insulating substrate;
   f) removing the photoresist layer to expose the blocking layer and an offset region between the blocking layer and the metal layer;
   g) crystallizing the amorphous silicon layer by diffusing metals in the metal layer through the capping layer into the amorphous silicon layer to form a polysilicon layer;
   h) etching the poly silicon layer using the first and second blocking patterns as a mask to form first and second semiconductor layers; and
   i) removing the first and second blocking patterns.

2. The method of claim 1, wherein the metal layer is made of Ni or Pd and has a thickness of 1 Å to 5000 Å.

3. The method of claim 1, wherein the capping layer is made of $SiO_2$ or $SiN_x$.

4. The method of claim 1, further comprising, after the step (i), surface-treating the first and second semiconductor layers.

5. The method of claim 4, wherein the surface treatment is performed using a dry-etching technique or an HF etching solution of 0.1% to 20%.

6. The method of claim 1, wherein the blocking layer is patterned using a dry-etching technique or an HF etching solution of 0.1% to 20%.

7. The method of claim 1, further comprising, before the step (a), forming a buffer layer on the insulating substrate.

8. The method of claim 1, wherein a high angle grain boundary formed in the step (g) is removed by etching process in the step (h).

9. The method of claim 1, further comprising:
   j) forming a gate insulating layer over said entire first surface of the insulating substrate;
   k) forming a gate electrode on the gate insulating layer over the first and second semiconductor layers;
   l) forming an interlayer insulating layer over said entire first surface of the insulating substrate;
   m) etching the interlayer insulating layer to form contact holes; and
   n) forming a source and drain electrode.

10. The method of claim 9, wherein the first and second semiconductor layers electrically coupled by the same layer as the gate electrode with each other.

11. The method of claim 9, wherein the first and second semiconductor layers electrically coupled by the same layer as the source and drain electrode with each other.

12. The method of claim 9, wherein the gate insulating layer over the first and second semiconductor layers has at least two contact holes in each other.

13. A thin film transistor manufactured by the method of claim 1.

14. The method of claim 1, wherein the first and second semiconductor layers electrically coupled by the same layer as the gate electrode with each other.

15. The method of claim 1, wherein the first and second semiconductor layers electrically coupled by the same layer as the source and drain electrode with each other.

16. The method of claim 1, wherein the gate insulating layer over the first and second semiconductor layers has at least two contact holes in each other.

17. A thin film transistor manufactured by the method of claim 1.

18. The method of claim 1, wherein in the step (g), a portion of the amorphous layer directly contacting the capping layer includes seeds, and the remaining portion of the amorphous silicon layer is crystallized through the SGS, so that a high-angle grain boundary exists on a portion of the poly silicon layer between the first and second blocking patterns.

19. The method of claim 1, further comprising: removing the capping and the metal layer.

* * * * *